Oct. 27, 1970 P. F. SCHMIDT 3,536,547
PLASMA DEPOSITION OF OXIDE COATINGS ON SILICON AND ELECTRON BOMBARDMENT OF PORTIONS THEREOF TO BE ETCHED SELECTIVELY
Filed March 25, 1968
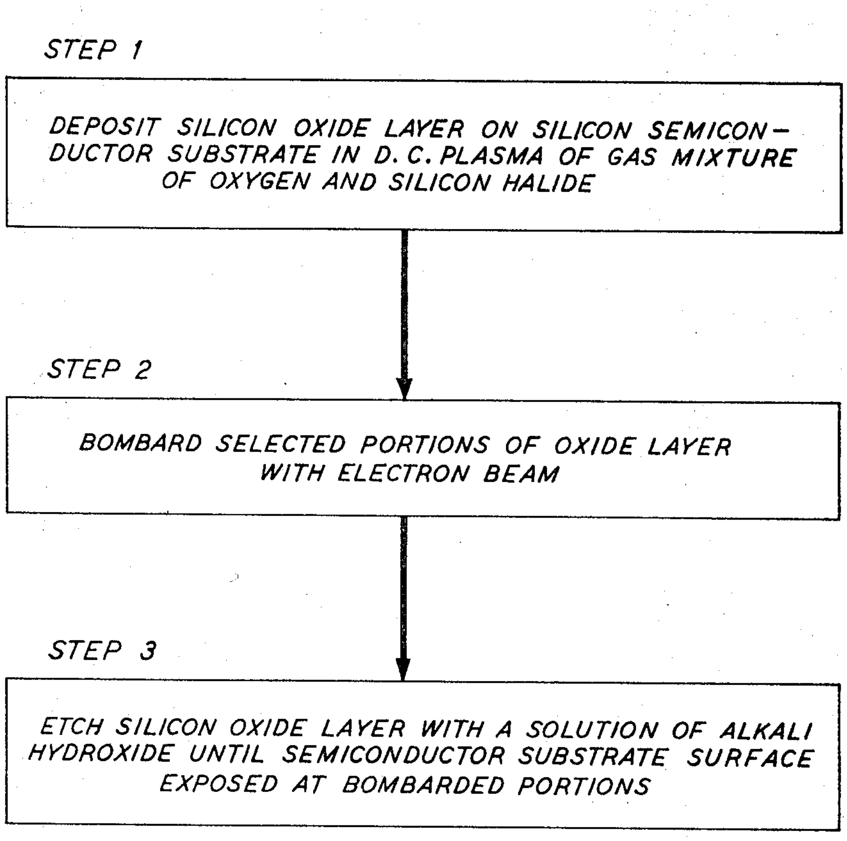
INVENTOR
P. F. SCHMIDT
BY H. W. Lockhart
ATTORNEY United States Patent Office 3,536,547

Patented Oct. 27, 1970

3,536,547

PLASMA DEPOSITION OF OXIDE COATINGS ON SILICON AND ELECTRON BOMBARDMENT OF PORTIONS THEREOF TO BE ETCHED SELECTIVELY

Paul F. Schmidt, Allentown, Pa., assignor to Bell Telephone Laboratories, Incorporated, Murray Hill and Berkeley Heights, N.J., a corporation of New York Filed Mar. 25, 1968, Ser. No. 715,596
Int. Cl. C23f *1/02;* H01l *7/50*
U.S. Cl. 156—17 10 Claims

ABSTRACT OF THE DISCLOSURE

In the fabrication of semiconductive devices involving the use of a silicon oxide type mask for control of the diffusion of impurities, fabrication of patterns of openings in the oxide mask on the surface of a semiconductive body substrate is achieved by the following steps:

(1) expose the semiconductive body to a direct current plasma discharge in a gaseous mixture of oxygen and silicon tetrabromide in such proportions as to form a silicon oxide type coating; ;

(2) bombard the oxide coating with kev. electrons according to the pattern of windows desired;

(3) expose the oxide coating to an alkaline hydroxide solution, until the coating is selectively dissolved in accordance with the desired pattern of openings therein.

BACKGROUND OF THE INVENTION

This invention relates to a method for fabricating semiconductor devices, such as diodes and transistors, by means of diffusion of impurities or impurity ion implantation through openings in a plasma deposited silicon oxide type film coating on the surface of the semiconductor.

The processing of semiconductor diffused junction devices, such as transistors, requires a method of delineating and controlling the contours of the diffused regions. It is well-known in the art that photoresist and masking techniques in conjunction with oxide films may be used to define the area of "window" openings through which the diffusion takes place. However, these techniques result in several disadvantages characteristics including pin holes in the film, fuzziness of the diffusion contours and undercutting beneath the mask; as well as suffering from limited resolution caused by optical diffraction.

It is also known that electron beam bombardment of silicon oxde layers may be used to create a pattern whch is more sensitive to (i.e., more easily dissolved by) etching solutions. The bombardment areas of the oxide thus show an enhanced differential etch rate compared to the rest of the oxide. Finer resolution and better quality can be obtained thereby than by photoresist methods. However, the enhancement factor of conventionally grown silicon oxides by thermal oxidation of a silicon substrate in a stream environment is relatively small, thereby requiring relatively long electron bombardment and etching times. Furthermore, the steam environment requires very high temperatures, which disturb any preexisting impurity profiles in the semiconductor. Likewise, the process of thermally growing silicon oxide layers by oxidation of a silicon substrate in dry oxygen suffers from the disadvantages of requiring very high temperature as well as relatively long times for the oxidation process.

Since electron bombardment oxide type films of silicon show an increased differential etch rate (enhancement factor) with better resolution and fewer pin holes, it is desirable to devise a method of depositing silicon oxide type films on semiconductors by rapid means; but which also has a relatively short exposure time in the electron bombardment and etching steps while maintaining a high differential etch rate between the electron bombardment and nonbombardment areas in the oxide film. Likewise, it is desirable in this method to deposit such silicon oxide films at temperatures significantly below the range of 800–1200° C. required in the thermal oxidation methods.

SUMMARY OF THE INVENTION

It has been found that alkaline etching solutions etch very selectively the silicon oxide type coatings which have been grown in dry environments and which have been selectively bombarded with electrons. In order not to disturb any preexisting impurity profiles during the oxide growth process, relatively low temperature electrical discharge methods in dry environments are used for the growth of the silicon oxide coating. Advantageously, dry plasma deposition or anodization techniques may be used for this purpose. Particularly suitable is the deposition of silicon oxide type coatings from a plasma discharge in a gaseous mixture of oxygen and a silicon halide, typically silicon tetrabromide, which may be used to deposit the silicon oxide type film upon any clean substrate which is nonvolatile (inert) at the somewhat elevated substrate temperature in the plasma. However, this somewhat elevated temperature, typically 300° to 400° C., is considerably lower than that conventionally used in the growth of silicon oxide coatings in the thermal oxidation methods of the prior art. Thereby, any preexisting impurity profiles in a semiconductive substrate, such as silicon or germanium are not disturbed in the plasma growth of the silicon oxide type coating. Thereafter, this oxide film is bombarded with electrons with energies in the kilovolt range for a relatively short time, in accordance with a desired pattern, i.e., at those selected portions of the film which are to be selectively etched to form "window" openings in the silicon oxide type film. A tape-steered scanning electron microscope, or a photocathode, may be used for this purpose, as known in the art.

The entire oxide film is thereafter treated in a suitable etching solution, advantageously an alkali hydroxide, which thereby etches the selected portions of the films at an enhanced differential rate as compared with the rest of the film. The etching is continued until the substrate is exposed at the selected portions, thereby creating the desired pattern of openings in the oxide film. Diffusion of impurities into the substrate may then be carried out in accordance with the desired pattern that is, at the selected portions of the film which were bombarded with the electrons and subsequently etched away. In this way, very precise geometric control over the desired pattern of openings in the oxide film, and hence the resulting diffusion pattern, may be obtained relatively quickly.

This invention together with its objects, features, and advantages may be better understood by the following detailed description when read in connection with the accompanying drawings in which:

The figure is a flow diagram of the method in accordance with this invention.

As indicated in Step 1 of the flow diagram in the figure, a clean inert semiconductive wafer substrate, for example, monocrystalline semiconductive silicon, upon which it is desired to form an oxide type coating with window openings therein according to a predetermined pattern, is subjected to a direct current plasma discharge. This discharge is produced typically in a chamber, for example, of the type as described in the U.S. patent application of A. Androshuk et al., Ser. No. 641,094, filed on Apr. 28, 1967, now U.S. Pat. No. 3,424,661, having the same assignee as this application. A gaseous mixture of oxygen and silicon halide is introduced into the chamber in the region of the plasma discharge. This mixture contains oxygen and silicon halide in such proportions as to deposit a silicon oxide type coating on the substrate, preferably the mixture is in the proportions of about 99.9 percent oxygen and 0.1 percent silicon tetrabromide; and at a total pressure equivalent to about 0.8 torr, i.e., 0.8 millimeter mercury. During discharge, typically, a potential difference of 200 volts is maintained between the anode and cathode which are spaced about 20 centimeters apart. The substrate is placed near or on the anode during the discharge, and is maintained at an elevated temperature, typically about 360° C. Temperatures between 300° C. and 400° C. may also be used to good advantage. In this manner, a silicon oxide type film coating is deposited upon the surface of the semiconductor wafer typically at a rate of approximately 200 angstroms per minute.

Thereafter, as indicated in Step 2 of the figure, selected portions of the coating are bombarded in a vacuum chamber with an electron beam according to the predetermined pattern of ultimately desired window openings. Typically, for a 3000 A. thick oxide layer, a tape-steered scanning 4.5 kev. electron microscope is used as the source of the electron beam for this bombardment step, as shown in the art. Alternatively, a photocathode may be used for the source of the electron beam. The electron beam intensity is adjusted so as to expose the selected portions of the coating to an amount of radiation dosage equal to between about $10^{12}$ and $10^{13}$ ergs per gram of oxide. This dosage corresponds to saturation; for example, by a current density between about one and 10 milliamperes per square centimeter for 300 seconds of 4.5 kev. electrons. The cross section of the electron beam can be made quite small, typically less than one micron, as may be desired in the ultimate pattern of openings in the oxide coating.

As is known in the art, the electron energy and the silicon oxide coating thickness are correlated, about 1.5 kev. being required for every 1000 A. of the coating.

After bombardment with the electron beam, the oxide coated substrate is then treated with an alkali hydroxide etching solution, as indicated in Step 3 of the figure. The electron bombarded portions of the oxide coating are especially sensitive to this type of etching solution. For example, a solution in the proportion of 250 gm. potassium hydroxide, 25 milliliters n-propanol, in 800 milliliter of water may advantageously be used to etch the oxide, at about 80° C.

Etching is continued with this solution until the underlying substrate is exposed at those portions which were subjected to the electron bombardment. The etch time required, of course, depends upon the thickness of the oxide coating; typically, the etch rate is approximately 500 A. per minute on the electron bombarded portions, and 100 A. per minute on the other portions of the oxide coating. Thereby, the oxide is etched preferentially according to the electron bombardment pattern, creating openings in the coating, and exposing the underlying substrate according to this pattern.

Semiconductor devices, such as diodes and transistors, may thereafter be fabricated by subjecting the semiconductor substrate, with the preferentially etched windows in the oxide coating, to various diffusions or ion implantations of conductivity determining impurities through the window openings in the oxide coatings, as known in the art.

In many applications of this process, it is advantageous to employ the steps in the above described plasma deposition of an oxide type coating with selective electron bombardment and etching, followed by the steps of impurity diffusion, several times in sequence; in order to fabricate complicated impurity patterns semiconductor devices, as should be obvious to those skilled in the art.

Instead of the silicon semiconductor substrate for the oxide deposition in the plasma, any inert semiconductive body may be used as a substrate, such as germanium or silicon carbide. By "inert" is meant that the substrate be essentially nonvolatile even while being subjected to the plasma discharge at the elevated temperatures indicated above.

In cases where it is desired to have a silicon oxide type coating on the surface of any type of inert body, with a pattern of window openings in the coating, the inert body itself is used as the substrate instead of the silicon body for the plasma discharge, selective electron bombardment and etching as described above.

While this invention has been described with reference to a preferred embodiment, it will be understood by those skilled in the art that modifications in form and detail may be made therein without departing from the spirit and scope of the invention.

What is claimed is:

1. The method of fabricating a semiconductor device employing a silicon oxide mask, with a predetermined pattern of openings therein, on the surface of a semiconductive body, comprising the steps of:

(a) locating the body in a direct current plasma discharge for a time and at a temperature in a gaseous mixture of silicon halide and oxygen in such proportions as to form a silicon oxide type layer on the semiconductive body;

(b) bombarding the layer with electrons of predetermined kinetic energy at selected portions in accordance with the predetermined pattern of openings; and (c) treating the bombarded layer with an alkali hydroxide solution to etch the surface selectively in accordance with the predetermined pattern of openings, thereby exposing the body in accordance with the predetermined pattern of openings and leaving an oxide type layer on said body in accordance with the complement of the predetermined pattern.

2. The method of claim 1 in which the said mixture is approximately 0.1 percent silicon tetrabromide and 99.9 percent oxygen.

3. The method of claim 2 in which the body is silicon.

4. The method of claim 1 in which the predetermined temperature is approximately 360° C., and the total pressure is about 0.8 torr.

5. The method of claim 1 in which the predetermined temperature is between about 300° C. and about 400° C.

6. The method of producing a predetermined pattern of openings in a layer of silicon oxide, which has been grown upon an inert body in a plasma discharge, which comprises:

(a) bombarding the layer with electrons of predetermined kinetic energy in accordance with the predetermined pattern of openings; and (b) treating the said surface with an alkali hydroxide solution to etch the surface selectively in accordance with the predetermined pattern of openings, thereby exposing the body in accordance with the predetermined pattern of openings and leaving an oxide type layer on said body in accordance with the complement of the predetermined pattern.

7. The method of claim 6 in which the predetermined kinetic energy is approximately 4.5 kev.

8. The method of claim 6 in which the said solution comprises a mixture in the proportions of approximately 250 grams of potassium hydroxide, 25 milliliters of n-propanol and approximately 800 milliliters of water.

9. The method of producing a predetermined pattern of openings in a layer of silicon oxide, which has been grown upon a body by means of an electrical discharge and which has been subjected to an electron bombardment in accordance with the said pattern, comprising the steps of:

treating the said surface with an alkali hydroxide solution to etch the surface selectively in accordance with the predetermined pattern of openings, thereby exposing the body in accordance with the predetermined pattern of openings and leaving an oxide type layer on said body in accordance with the complement of the predetermined pattern.

10. The method of claim 9 in which the said hydroxide solution comprises a mixture in the proportions of approximately 250 grams of potassium hydroxide, 25 milliliters of n-propanol and approximately 800 milliliters of water.

References Cited

UNITED STATES PATENTS

| | | | |
|---|---|---|---|
| 3,156,591 | 11/1964 | Hale et al. | 148—175 |
| 3,471,291 | 10/1969 | Schaefer | 96—36.2 |

JACOB H. STEINBERG, Primary Examiner

U.S. Cl. X.R.

156—2; 204—143, 164; 29—578, 584